United States Patent [19]

Wangler et al.

[11] Patent Number: 5,675,401
[45] Date of Patent: *Oct. 7, 1997

[54] ILLUMINATING ARRANGEMENT INCLUDING A ZOOM OBJECTIVE INCORPORATING TWO AXICONS

[75] Inventors: Johannes Wangler, Künigsbronn; Gerald Richter, Abtsgmünd, both of Germany

[73] Assignee: Carl-Zeiss-Stiftung, Oberkochen, Germany

[*] Notice: The term of this patent shall not extend beyond the expiration date of Pat. No. 5,646,715.

[21] Appl. No.: 490,752

[22] Filed: Jun. 15, 1995

[30] Foreign Application Priority Data

Jun. 17, 1994 [DE] Germany ............ 44 21 053.1
Nov. 25, 1994 [DE] Germany ............ 44 41 947.3

[51] Int. Cl.[6] ............................ G03B 27/54; G03B 27/72
[52] U.S. Cl. ............................ 355/67; 355/53; 355/71
[58] Field of Search ............................ 355/67, 53, 71; 362/268

[56] References Cited

U.S. PATENT DOCUMENTS

| | | | |
|---|---|---|---|
| 5,208,629 | 5/1993 | Matsuo et al. | 355/53 |
| 5,237,367 | 8/1993 | Kudo | 355/67 |
| 5,245,384 | 9/1993 | Mori | 355/67 |
| 5,343,489 | 8/1994 | Wangler | 372/93 |
| 5,345,292 | 9/1994 | Shiozawa et al. | 355/67 |
| 5,357,312 | 10/1994 | Tounai | 355/67 |
| 5,452,054 | 9/1995 | Dewa et al. | 355/67 |

FOREIGN PATENT DOCUMENTS

| | | |
|---|---|---|
| 0297161 | 1/1989 | European Pat. Off. |
| 0346844 | 12/1989 | European Pat. Off. |
| 0490291 | 6/1992 | European Pat. Off. |
| 0564264 | 10/1993 | European Pat. Off. |
| 0627643 | 12/1994 | European Pat. Off. |
| 5-251308 | 9/1993 | Japan |
| WO94/20883 | 9/1994 | WIPO |

OTHER PUBLICATIONS

"Depth of Focus and Resolution Enhancement for i–line and deep–UV Lithography Using Annular Illumination" by W. Partlo et al, SPIE, vol. 1927, Optical/Laser Microlithography VI (1993), pp. 137 to 157.

*Primary Examiner*—Arthur T. Grimley
*Assistant Examiner*—Herbert V. Kerner
*Attorney, Agent, or Firm*—Walter Ottesen

[57] ABSTRACT

An illumination system for an optical system such as a microlithographic projection exposure system includes a zoom lens 2 for varying the degree of coherence σ and two axicons (22, 23) with an adjustable distance therebetween. The distance can preferably be reduced to zero. The illumination system provides continuous, conventional illumination with a variable degree of coherence σ and annular illumination or multipole illumination with different geometries with low losses of light.

19 Claims, 7 Drawing Sheets

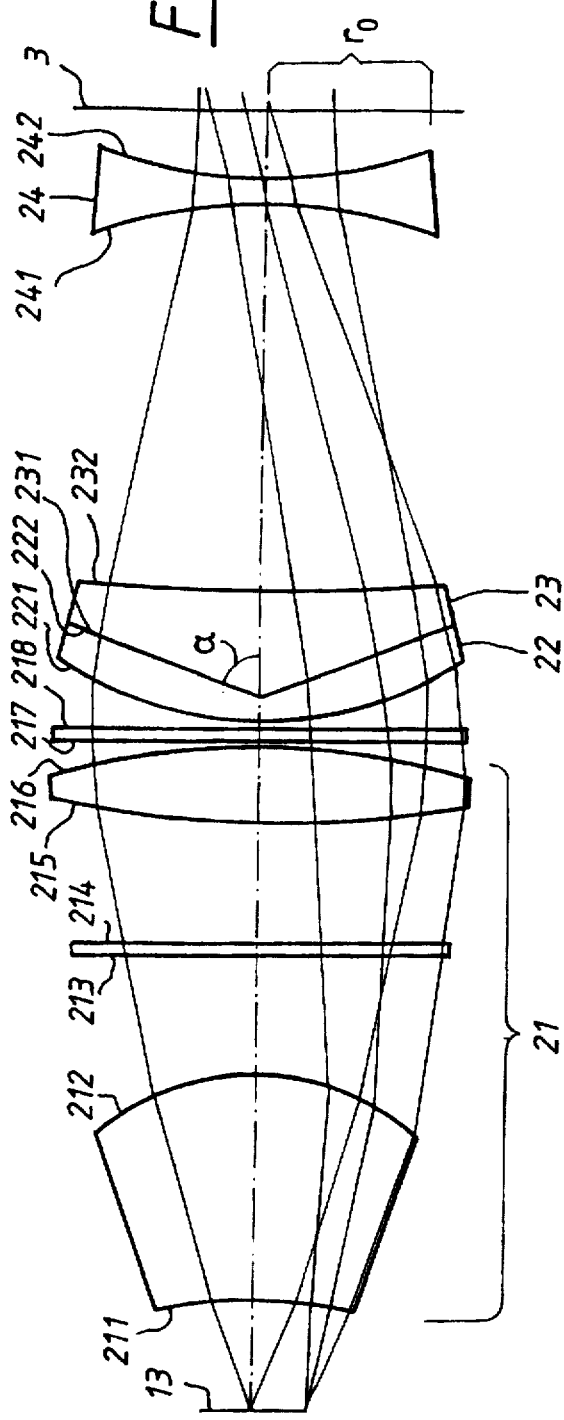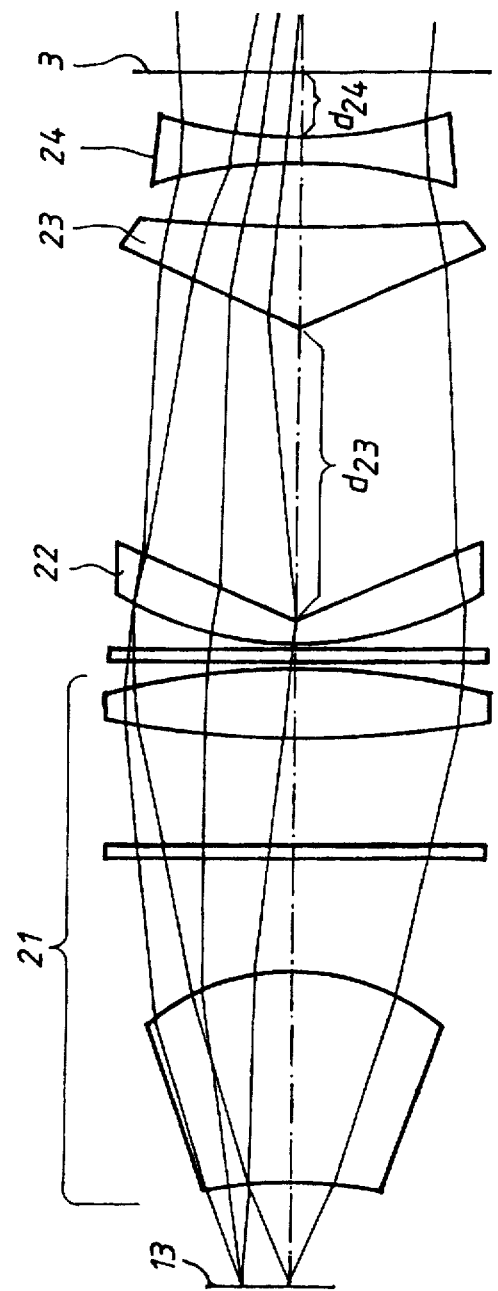

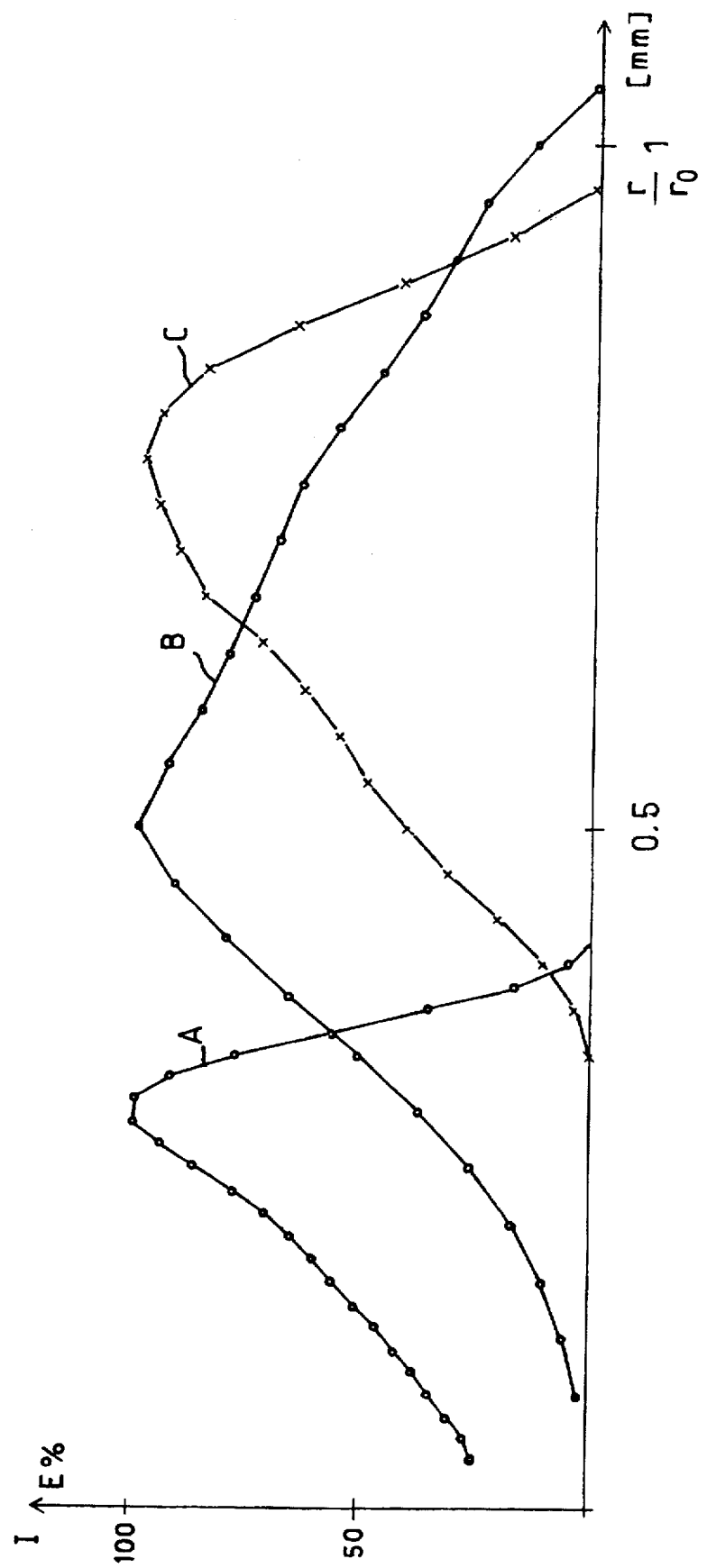

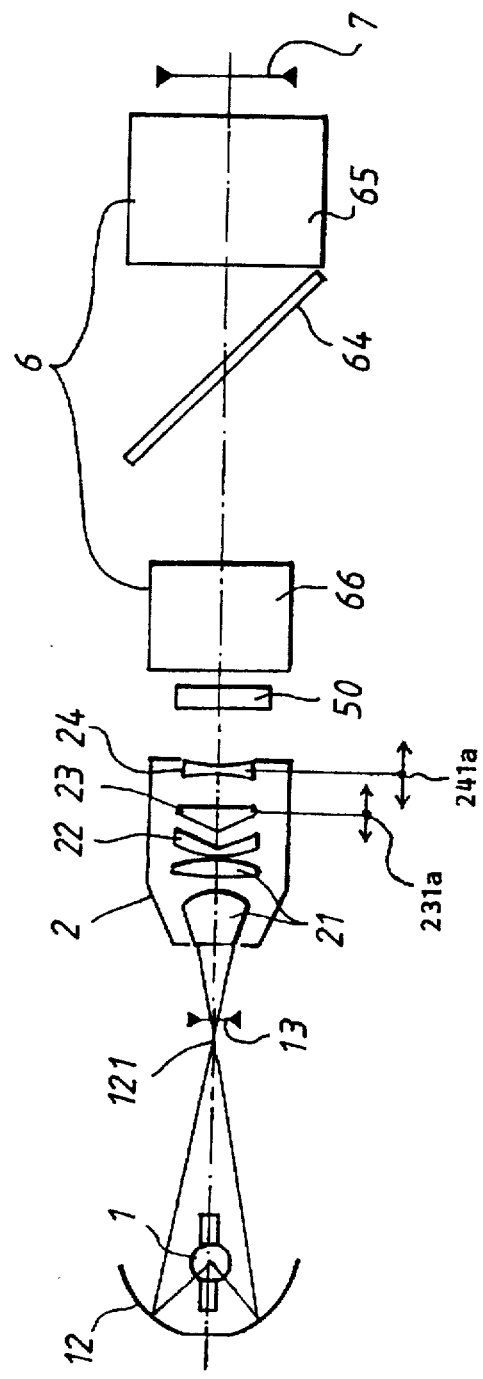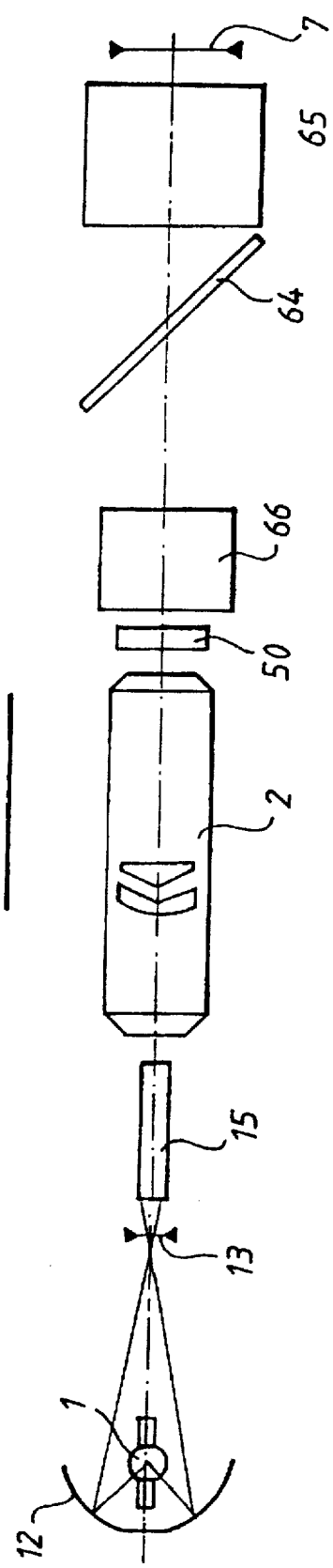

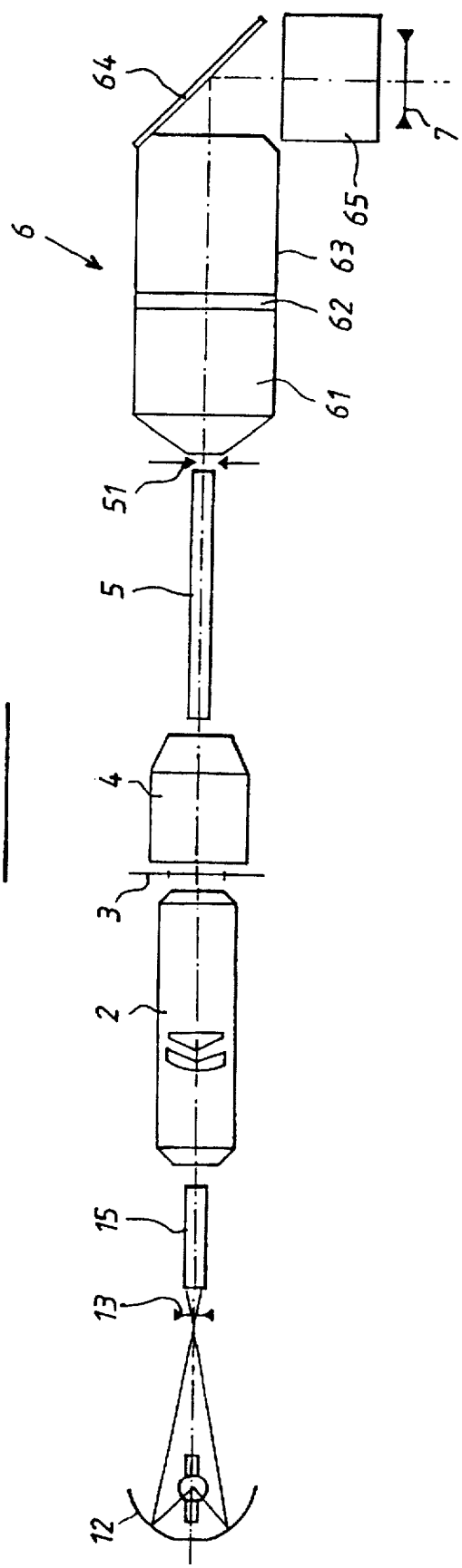
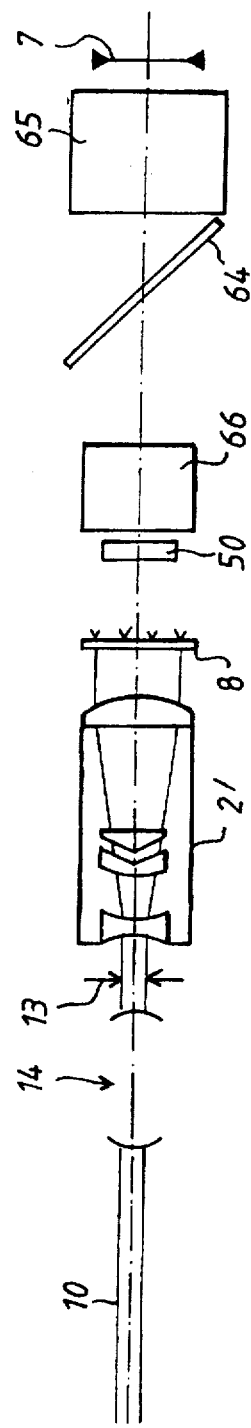
FIG.4c
FIG.4d 5,675,401

ILLUMINATING ARRANGEMENT INCLUDING A ZOOM OBJECTIVE INCORPORATING TWO AXICONS

FIELD OF THE INVENTION

The invention relates to an illumination system for an optical system such as for a microlithographic projection exposure system having two axicons.

BACKGROUND OF THE INVENTION

A generic illumination system is disclosed in the paper of W. N. Partlo et al. entitled "Depth of Focus and Resolution Enhancement for i-line and deep-UV Lithography Using Annular Illumination", and published in SPIE, Vol. 1927, Optical/Laser Microlithography VI (1993), pages 137 to 157 (FIGS. 19, 20). This system provides a collimated beam path in which two axicons are positioned between two lenses located between the light source and the light integrator, with one axicon being concave, the other convex and both having a planar second boundary surface. To allow optimum illumination of various ring-shaped diaphragms, the distance between the axicons can be varied from zero which means that conventional illumination is also possible.

European patent publication 0,564,264 discloses that a conical lens (an axicon) can be used in wafer steppers to generate an annular illumination, or pyramid-shaped prisms (FIGS. 7, 8) to generate multipole illumination. Here, the use of two axicons (FIGS. 17 and 19) is also known; however, the two axicons are separated by other optical components. The conical or pyramid-shaped surfaces are both convex.

Japanese patent publication 5/251,308 discloses that concave-conical components are also usable in this context.

European patent publication 0,346,844 describes the use of pairs of convex-conical lens elements for splitting up of the illumination beam to achieve point imaging along with superresolution. The apexes of the convex-conical lens elements point in opposite directions.

U.S. Pat. No. 5,208,629 discloses the use of pyramid-shaped or conical axicon lenses (also with a convex-concave shape) for providing a low loss symmetrical oblique illumination (multipole illumination) in a wafer stepper. This system has no zoom function.

Zoom systems for varying the degree of coherence have been used in an illumination system for wafer steppers including fly-eye integrators since 1987 by the ASM-L Corporation of the Netherlands.

U.S. Pat. No. 5,237,367 discloses the use of a zoom lens in the illumination system of a wafer stepper to achieve the no-loss adjustment of the degree of coherence σ for conventional illumination.

U.S. Pat. No. 5,245,384 discloses an afocal zoom system used in the illumination system of wafer steppers, allowing the low-loss adaptation of the coherence factor σ. An axicon is not provided.

U.S. Pat. No. 5,357,312 discloses an illumination system in an exposure apparatus for photolithography including: a first pair of axicons for the elimination of the central dark spot which is produced by the usual type of discharge lamps, an adjustable pair of axicons for optional adjustment of a ring-shaped diaphragm, a zoom system for the adaptation of the illumination bundle diameter to a diaphragm used as a secondary light source, and a fly-eye integrator acting as a light integrator positioned in front of this diaphragm. The serial arrangement of all these components in the order described is provided, with parallel ray bundles between every two components being imperative.

For a projection exposure system using a light guide glass rod in the illumination beam path, European patent publication 0,297,161 discloses that a variable-density filter can be used after the glass rod. This filter apparently improves homogenization and does not stop down the illumination.

As technology is progressing closer and closer to the resolution limits of optical projection for microstructuring, the illumination used must be optimized for the structures of the individual patterns, that is, it must be possible to adjust optimized annular or quadrupole illumination or other types of illumination.

SUMMARY OF THE INVENTION

It is an object of the invention to provide an especially flexible, adjustable illumination system which allows a multitude of illumination modes by adjusting components without the need for an exchange thereof, and with as high efficiency as possible while providing a compact configuration at the same time.

The illuminating arrangement of the invention is for an optical system such as a microlithographic projection exposure apparatus. The illuminating arrangement includes: a light source for emitting illuminating light along an optical axis; a zoom objective mounted on the optical axis and having first and second zoom lenses for transmitting the light; a first displacement drive for shifting one of the lenses along the axis to adjust the coherence factor σ of the light transmitted by the lenses; two axicons arranged in the zoom objective; and, a second displacement drive for shifting the two axicons relative to each other along the optical axis for adjusting the distance therebetween.

The flexibility thus achieved in the shaping of the light beam cross section is optimized by configuring the axicons with identical apex angles and by permitting the distance between the axicons to be reduced until they come into mutual contact. The boundary case of conventional illumination, in particular, can then be implemented.

If the axicons are conical, the arrangement is especially suitable for an annular field illumination. If pyramid-shaped axicons are used, multipole illumination is optimized.

It is especially advantageous if the secondary boundary surfaces have a lens effect thereby making the design of the zoom lens more compact and simple.

Another advantage of the illumination system according to the invention is that a variable adjustment of conventional, annular field illumination or multipole illumination is possible over a wide range.

According to another feature of the invention, a glass rod functions as a light integrator in the illumination system according to the invention and a masking system is provided at the output end face of the rod. A reticle masking system located directly on the reticle is made unnecessary which, especially if it is to be adjustable, would cause problems there. A separate intermediate imaging system for a reticle masking system is also made unnecessary. At the same time, production is simplified, while maintaining high quality.

The provision of the usual shutter (which defines a stop at the same time) outside the focus of the lamp mirror is an additional feature to improve the homogeneity of the illumination. This feature proves especially successful in combination with the other features of the invention.

The illumination system described allows the setting of the above-mentioned, different illumination modes entirely without any diaphragms which would otherwise be required for the shaping of the light bundle emerging from the light integrator and which would have to be adjustable or interchangeable to obtain the different illumination modes. The entire shaping process is implemented by adjusting the zoom-axicon lens thereby making this process ideally suitable for programmed computer control. The quality of the individual illumination modes can be significantly enhanced by increased sophistication of the zoom-axicon assembly.

Fixed stops for the suppression of scattered light and similar phenomena can be positioned in the beam path wherever this is advantageous.

According to another feature of the invention, two elements of the zoom lens are displaceable. This provides additional freedom in the lens design for matching the zoom effect to the axicon effect. For large σ, that is, for large areas of illumination, the intensity is enhanced at small and large radii resulting in more uniform illumination.

Here, it is advantageous if the additionally introduced zoom element is configured in such a way that it can approach a neighboring lens element until it comes into contact therewith, in particular if both elements have the same refractive index.

According to another feature of the invention, small, illuminated areas (that is, a small degree of coherence σ) are obtained when both displaceable lens elements are positioned far away from the two axicons. A large degree of coherence σ is obtained when these displaceable lens elements are as close as possible to the axicons.

BRIEF DESCRIPTION OF THE DRAWINGS

The invention will now be described in greater detail with reference to the drawings wherein:

FIG. 2a shows a section view of the zoom-axicon lens included in the embodiment of FIG. 1 showing the axicons moved together to a mutual spacing of zero;

FIG. 2b corresponds to FIG. 2a but with axicons separated from each other;

FIG. 3 is a graph showing the intensity of the light as a function of the radius in the pupil intermediate plane for different zoom and axicon positions of the arrangement according to FIGS. 2a and 2b;

FIG. 4a is a schematic of another embodiment of the illumination system of the invention;

FIG. 4b is a schematic of a further embodiment of the invention;

FIG. 4c is a schematic showing a further embodiment of the invention;

FIG. 4d is a schematic of still another embodiment of the invention;

DESCRIPTION OF THE PREFERRED
EMBODIMENTS OF THE INVENTION

Figure 1:
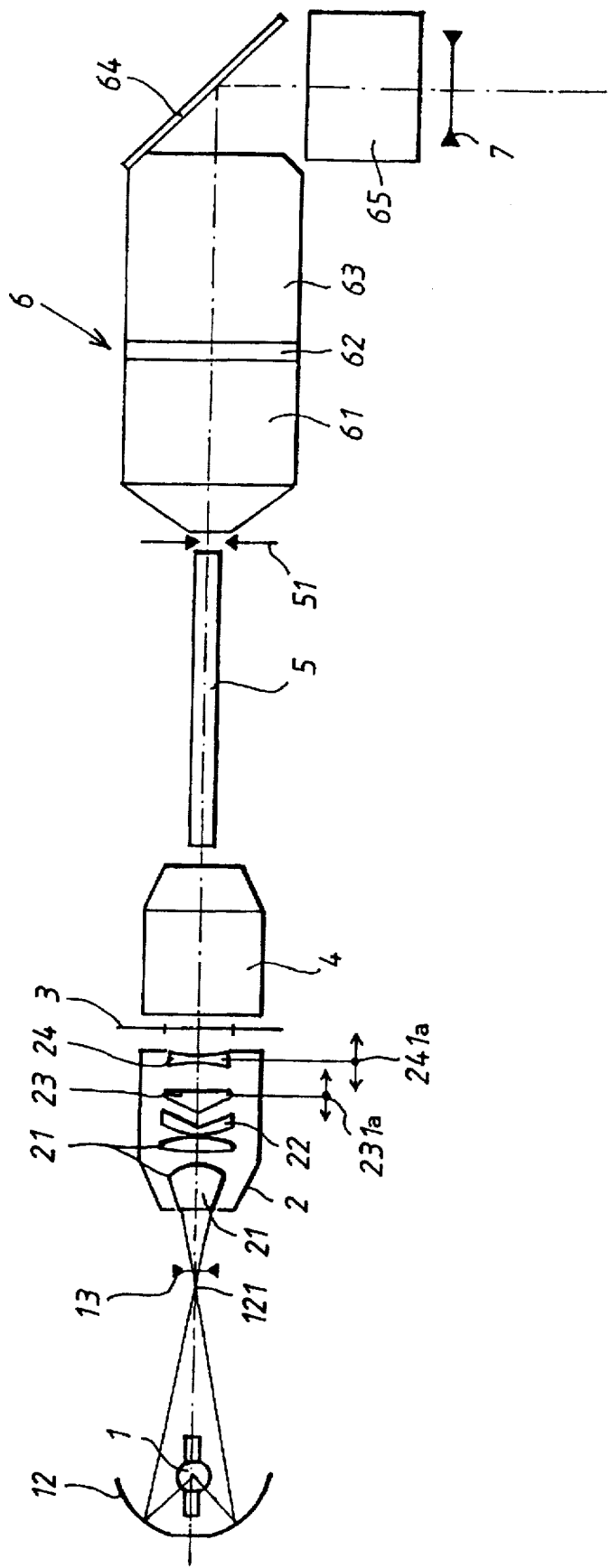
FIG. 1 shows a schematic of a preferred embodiment of the illumination system according to the invention.

FIG. 1 shows an embodiment of an illumination system according to the invention for projection lithography with a resolution down to a fraction of 1 μm, for example, for the fabrication of integrated circuits.

A lamp 1 is positioned in one focal point of the elliptical mirror 12 which collects the emitted light in the second focal point 121. The lamp 1 is a mercury short-arc lamp for the i-line at the wavelength of 365 nm.

Unlike the standard configuration, the shutter 13 (being a diaphragm at the same time) is located away from the focal point 121, with the distance of the shutter from the vertex of the elliptical mirror 12 being approximately 5% to 20%, (preferably 10%) longer than the distance of the focal point 121 from the vertex of the mirror. This ensures that the secondary light source formed here becomes more homogeneous and that the partially coherent effect of the illumination on the optical image is improved. This makes a separate mixing system superfluous which normally accomplishes this purpose. This procedure is also advisable for an otherwise conventional illumination system.

The objective lens 2 follows and comprises a first group 21, the concave first axicon 22, the convex second axicon 23 and a second lens group 24. Positioning drives 231a and 241a of any conventional construction allow the axial displacement of one axicon 23 and one element of the second group 24. This makes it possible not only to vary the distance between the axicons (22, 23) and thereby change the annular illumination character, but also to achieve a zoom effect for changing the diameter of the illuminated pupil, that is, the degree of coherence σ.

A second objective lens 4 is located after the pupil intermediate plane 3 and is used to couple the light into the glass rod 5 which has a length of approximately 0.5 m. The output surface of the glass rod 5 is an intermediate field plane in which a masking system 51 is mounted. This can be utilized in lieu of a conventional REMA (reticle-masking) system. The additional intermediate field plane otherwise required for the REMA system including complex lens element groups is no longer necessary.

The next objective lens 6 images the intermediate field plane including the masking system 51 located on the reticle 7 (mask, lithography pattern) and contains a first group 61, a pupil intermediate plane 62 where filters or diaphragms can be positioned, a second and third lens group (63 and 65) and, positioned therebetween, a deflecting mirror 64 which allows the horizontal installation of the large illumination system (approximately 3 m long) and the horizontal mounting of the reticle 7.

The component common to all embodiments of the illumination system is the objective lens 2. An embodiment of the objective lens 2 is shown in FIG. 2a and Table 1 delineates the lens data therefor.

The first lens group 21 in FIG. 2a contains two lenses having the surfaces (211, 212; 215, 216) and two planar plates having the surfaces (213, 214; 217, 218) which can be configured as filters.

The two axicons (22, 23) have the same conical angle α and can therefore be moved towards each other until they come into mutual contact as shown in FIG. 2a. In this position, the conical surfaces (222, 231) of the axicons have no effect and the axicons conjointly define a simple lens because their second boundary surfaces (221, 232) are curved. This lens element is of importance for the correction of the objective lens 2 because the beam path through the axicon (22, 23) is not collimated. The lens 24 is axially displaceable and makes this arrangement a zoom lens of conventional design. This allows the implementation of conventional illumination with a variable pupil diameter in the pupil plane 3, that is, with a variable coherence factor σ preferably in the range of 0.3 to 0.8. The distance between the two axicons (22, 23) is adjusted as required using the positioning means 231a. This case is illustrated in FIG. 2b which corresponds to FIG. 2a in all other respects.

The second group 24 is configured as a single biconcave element having surfaces (241, 242). The shutter 13 and the pupil plane 3 are also shown in FIGS. 2a and 2b.

FIG. 3 shows intensity curves I of the light as a function of $r/r_o$ in the pupil plane 3 for different positions of the axicon 23 and the lens 24. The curve A applies to the position according to FIG. 2a and the curve B applies to a position where, starting from FIG. 2a, the lens 24 has been moved close to the axicon 23. The curve C applies to the position of the axicons (22, 23) shown in FIG. 2b. The distance d23 between the axicons (22, 23) determines the distinctness of the annular field illumination with its central, dark disc. The disc becomes larger with increasing distance d23. The distance d24 determines the zoom effect, that is the overall diameter of the illuminated area in the pupil plane 3. The annular illumination provides high efficiency because it is produced without masking out the center disc. A (small) dark on-axis spot remains even when the two axicons (22, 23) are completely united. This is usually due to the design of the lamp 1 and the concave mirror 12. This effect has also been deliberately intended because it provides space for accommodating auxiliary systems such as for focusing and positioning systems. If required, the dark spot can be eliminated using known means, such as additional stationary axicons in front of the objective lens 2. In this connection, reference can be made to U.S. Pat. No. 5,357,312 incorporated herein by reference.

Multipole illumination (symmetrical, oblique illumination) is obtained if a multi-aperture diaphragm is inserted in the pupil plane 3 or in a plane equivalent thereto of the illumination system, with this diaphragm allowing, for example, only four light bundles or beams to pass from the annular illuminating field.

Special illumination geometries can be provided by imparting a different shape to the axicons (22, 23); for example, the axicons can have a pyramid shape with a square base for quadrupole illumination (the outline of the axicons in FIGS. 2a and 2b remains the same for axicons having a pyramid shape).

Additional variants of the illumination system according to the invention are shown in FIGS. 4a to 4d. Identical components have the same reference numbers as in FIG. 1.

FIG. 4a shows an embodiment in which the glass rod 5 of FIG. 1 has been replaced by a fly-eye integrator 50. This is an alternative which also reduces the design length. However, in this embodiment, the option of the REMA system described above cannot be implemented. The objective lens 6 consists of the two lens groups 66 and 65 including the interposed deflecting mirror 64 (the schematic is on a continuous optical axis for the purpose of illustration).

Compared to FIG. 4a, FIG. 4b shows an additional glass rod 15 of the type of glass rod 5 in FIG. 1 which is positioned between the shutter 13 and the zoom-axicon lens 2. This allows further homogenization of the illumination of the pupil plane on the fly-eye integrator 50. The zoom-axicon lens 2 here incorporates more lens elements and is accordingly longer.

FIG. 4c shows an arrangement according to FIG. 1, but with the additional glass rod 15 and the longer zoom-axicon lens 2 of FIG. 4b.

FIG. 4d shows a variant of the illumination system according to the invention in which a laser beam 10 is used as the light source. This is preferably an excimer laser beam having a wavelength in the deep UV range. The shape of the laser beam 10 typically is a narrow rectangle. The use of a beam-shaping device 14 (for example according to U.S. Pat. No. 5,343,489 incorporated herein by reference) makes it possible both to give a more favorable shape to the laser beam 10 (which typically is a narrow rectangle) and to reduce spatial coherence at the same time. The shutter 13 is followed by a modified zoom-axicon lens 2' which is configured here as a beam-expanding telescope. A diffusion disc or a diffracting component 8 used as a secondary light source to further reduce coherence is followed, as in FIGS. 4a and 4b, by the appropriately adapted fly eye integrator 50 and objective lens 6 and the reticle 7. It is also possible to combine the laser source with a glass rod according to FIGS. 1 and 4c.

Figure 5:
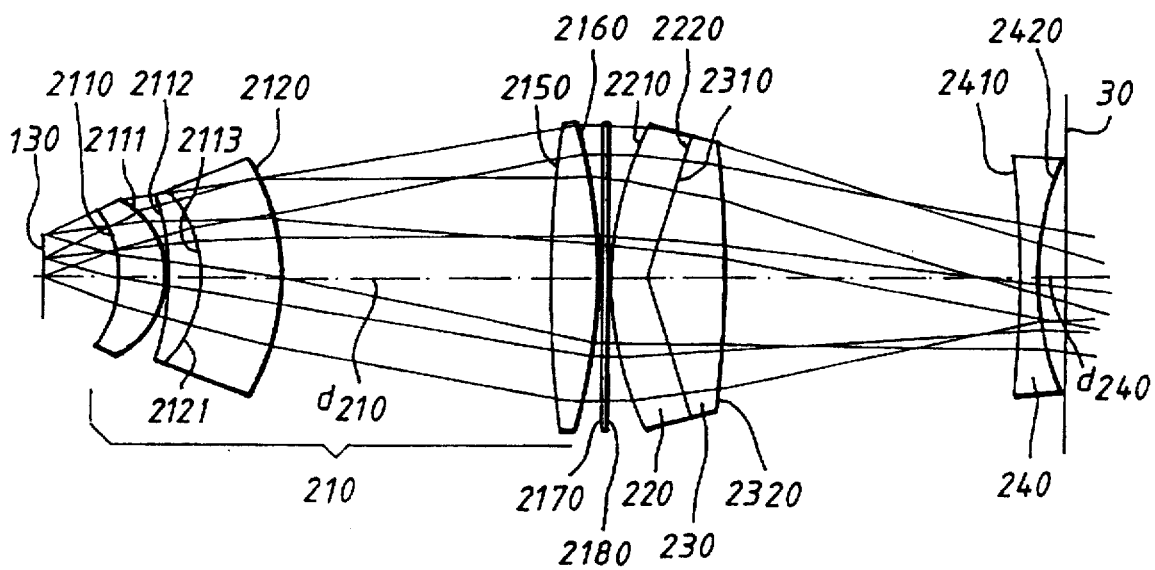
FIG. 5 is a section view of an embodiment of a zoom-axicon lens included in the illumination system according to the invention with the distance between the axicons reduced to zero and the zoom elements in their respective positions for providing minimum spot illumination.

Like FIG. 2a, FIG. 5 shows a section view of a further embodiment of a zoom-axicon lens provided for the illumination system according to the invention. The lens is positioned between the plane 130 of the shutter representing a secondary light source and the pupil intermediate plane 30 and comprises a first lens group 210, the pair of axicons (220, 230) and the zoom element 240, thus corresponding to FIG. 2a. The first group 210, however, provides a second zoom element with the surfaces (2121, 2120) which, in the adjustment position shown, is completely seated against the surface 2113 of the element positioned in front of it. As far as feasible and optically relevant, the surfaces (2113, 2121) are provided with identical radii of curvature. In addition, the two pertinent lens elements consist of the same glass with the refractive index n. In the adjustment position shown, therefore, the surfaces (2113, 2121) and the conical surfaces (2220, 2310) of the axicons (220, 230) have no optical power. This adjustment position is suitable for conventional illumination providing a small coherence factor σ, that is, a small illuminated area in the pupil intermediate plane 30. Annular field illumination is achieved by moving the axicons (220, 230) apart as shown in FIG. 2b.

Figure 6:
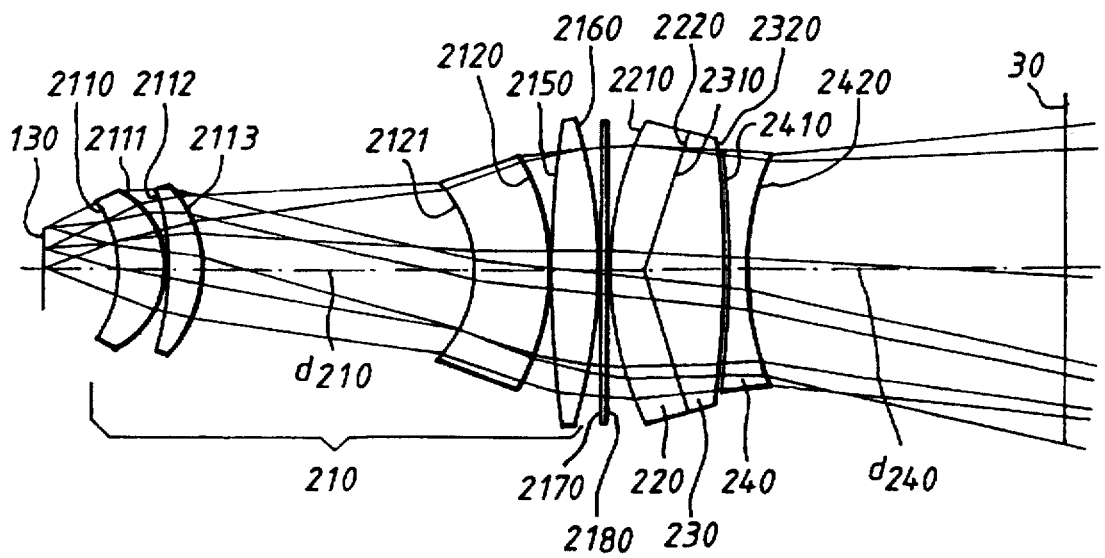
FIG. 6 corresponds to FIG. 5 but with the zoom elements in their positions for maximum spot illumination; and, FIG. 7 is a graph showing the intensity of light as a function of the radius in the pupil intermediate plane for different zoom and axicon positions of the arrangement according to FIGS. 5 and 6.

FIG. 6 shows the adjustment position for the maximum coherence factor σ for the same embodiment as in FIG. 5. Here, the zoom element 240 has been moved right up to the axicon 230, while, at the same time, the second zoom element having the surfaces (2121, 2120) has been moved far away from the lens element surface 2113 to the vicinity of the surface 2150 of the last lens of the first lens group 210.

Table 2 specifies the radii, distances and types of glass for all elements incorporated in the objective lens according to FIGS. 5 and 6. The plane plate (2170, 2180) is provided as a filter component.

This embodiment mainly differs from the embodiment of FIGS. 2a and 2b in that the pronounced curvature of the second surface 2111 of the first element results in a narrower peripheral illumination.

In the wide illumination mode, the distance $d_{210}$ between the second lens (2112, 2113) and third lens (2121, 2120) is as long as possible. This distance $d_{210}$ together with the positive refractive power of the second lens (2112, 2113) causes a shift of the light bundle towards the edge of the illuminated field 30 which results in a higher illumination intensity in this area. In addition, the shift of the field zone light bundle improves the illumination in the center of the illuminated field 30. As no light intensity is present on the light entrance side 130 at small angles (illumination by a discharge lamp with electrodes on the optical axis and with a parabolic mirror), the four-lens reference system of FIGS. 2a and 2b only illuminates the center of the field 30 weakly.

The axicon effect results in an annular field illumination. The width of the ring is predetermined by the pancratic adjustment; and, irrespective of this adjustment, the position of the annular field is adjusted by moving the axicon element 230.

Figure 7:
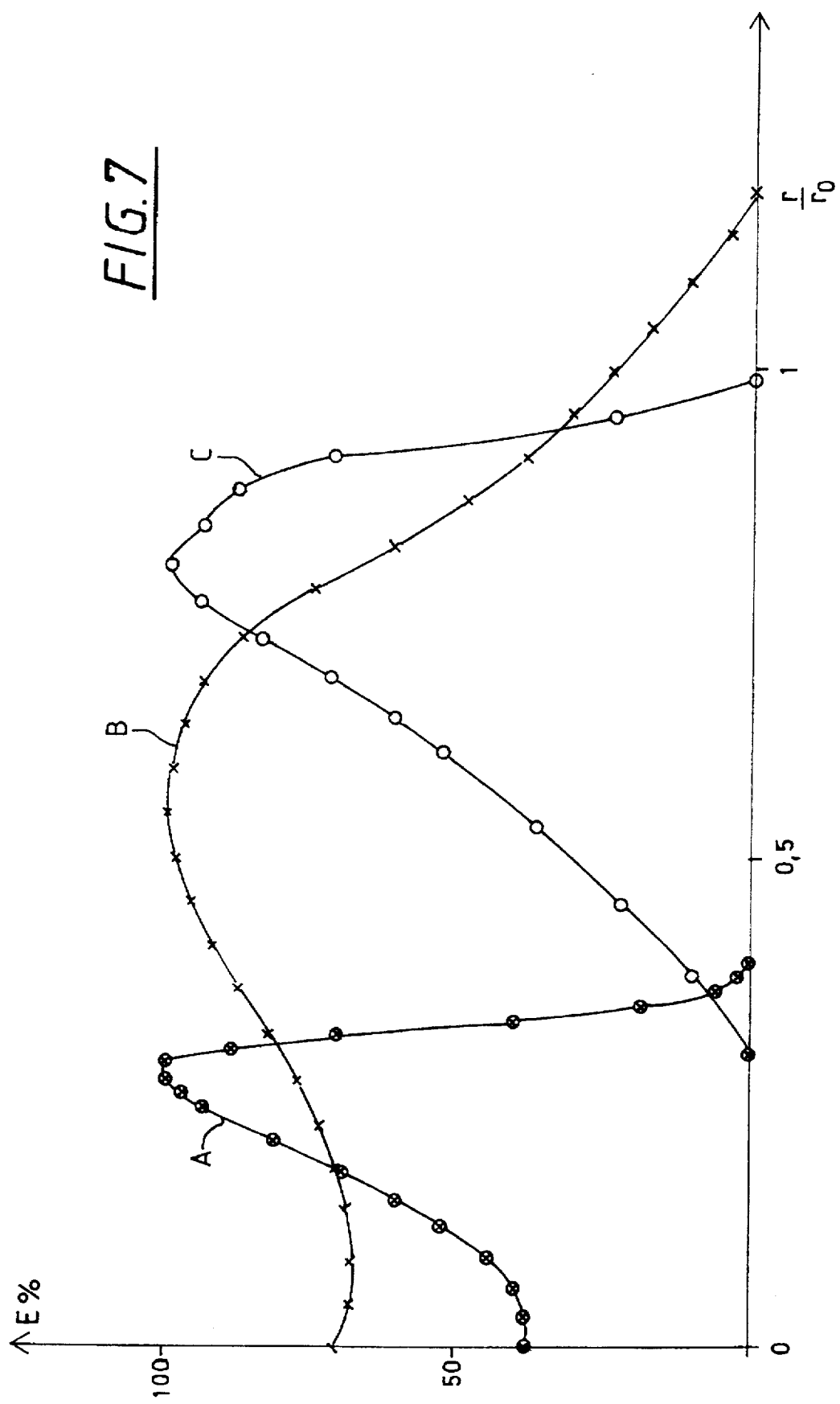

If the maximum axicon effect is combined with the narrowest pancratic adjustment, resulting in the minimum annular field width, then the illumination intensity curve C shown in FIG. 7 will be obtained.

Curve B applies to the adjustment position according to FIG. 6 and curve A to the adjustment position according to FIG. 5. Compared to FIG. 3, curve B shows the improved illumination in the center and on the periphery.

The variants presented are only a selection of typical embodiments. The application of the invention is not limited to projection microlithography. A simpler variant of the invention is also suitable, for example, as a variable illumination system for microscopes or an illumination system for pattern-recognition apparatus.

TABLE 1

Wavelength 360.00 nm

| No. | Radius | Thickness | Type of glass |
|---|---|---|---|
| 13 | plane | 10.20 | |
| 211 | −199.5 | 87.40 | quartz |
| 212 | −92.4 | 45.20 | |
| 213 | plane | 4.35 | |
| 214 | plane | 46.54 | |
| 215 | 393.8 | 29.00 | FK5 |
| 216 | −302.9 | 2.15 | |
| 217 | plane | 5.00 | FK5 |
| 218 | plane | 2.15 | |
| 221 | 135.3 | 8.00 | FK5 |
| 222 | conical | 0.00 | variable |
| 231 | conical | 42.00 | FK5 |
| 232 | 739.1 | 26.53 | |
| 241 | −183.0 | 9.40 | FK5 |
| 242 | 170.3 | 26.38 | variable |
| 3 | plane | | |

Conical angle α = 63° for conical surfaces 222 and 231

TABLE 2

| No. | Radius | Thickness | Type of glass |
|---|---|---|---|
| 130 | plane | 35.0 | |
| 2110 | −48.0 | 24.3 | quartz |
| 2111 | −40.1 | 0.6 | |
| 2112 | −94.4 | 14.6 | FK5 (Schott) |
| 2113 | −56.6 | 0.2−130.5($d_{210}$) | |
| 2121 | −56.6 | 37.4 | FK5 |
| 2120 | −101.5 | 130.4−0.2 | |
| 2150 | 578.8 | 21.8 | FK5 |
| 2160 | −254.8 | 2.1 | |
| 2170 | plane | 2.2 | |
| 2180 | plane | 2.1 | |
| 2210 | 154 | 8.0 | FK5 |
| 2220 | conical | variable | |
| 2310 | conical | 46.0 | FK5 |
| 2320 | −2512 | 143.1−0.2 | |
| 2410 | −2512 | 9.1 | FK5 |
| 2420 | 128.6 | 23.1−166($d_{240}$) | |
| 30 | plane | | |

Conical angle α = 62° for conical surfaces 2220 and 2310

It is understood that the foregoing description is that of the preferred embodiments of the invention and that various changes and modifications may be made thereto without departing from the spirit and scope of the invention as defined in the appended claims.

What is claimed is:

1. An illuminating arrangement for an optical system such as a microlithographic projection exposure apparatus, the illuminating arrangement comprising:
   a light source for emitting illuminating light along an optical axis;
   a zoom objective mounted on said optical axis and defining a light-entry surface and a light-exit surface and said zoom objective having at least one zoom lens;
   a first displacement drive for shifting said zoom lens along said axis for varying the degree of coherence σ of said illuminating light
   two axicons integrated within said zoom objective between said light-entry surface and said light-exit surface; and,
   a second displacement drive for shifting said two axicons relative to each other along said optical axis for adjusting the distance therebetween.

2. The illuminating arrangement of claim 1, said axicons each defining an apex angle α and the apex angles of said axicons being substantially equal.

3. The illuminating arrangement of claim 2, at least one of said axicons being movable along said optical axis to reduce said distance until said axicons come in contact engagement with each other.

4. The illuminating arrangement of claim 1, said axicons defining respective conical surfaces.

5. The illuminating arrangement of claim 1, said axicons defining respective pyramidal surfaces.

6. An illuminating arrangement for an optical system such as a microlithographic projection exposure apparatus, the illuminating arrangement comprising:
   a light source for emitting illuminating light along an optical axis;
   a zoom objective mounted on said optical axis and having first and second zoom lenses for transmitting said light;
   a first displacement drive for shifting one of said lenses along said axis to adjust the coherence factor σ of said light transmitted by said lenses;
   two axicons arranged in said zoom objective;
   a second displacement drive for shifting said two axicons relative to each other along said optical axis for adjusting the distance therebetween; and,
   said axicons having respective contact surfaces which come into mutual contact engagement when said distance is reduced to a minimum; at least one of said axicons having a boundary surface opposite the contact surface thereof; and, said boundary surface being curved.

7. The illuminating arrangement of claim 1, wherein the light emitted by said light source and transmitted by said axicons is noncollimated.

8. The illuminating arrangement of claim 1, wherein conventional illumination and annular illumination or multipole illumination with different geometries can be continuously adjusted by varying said distance between said two axicons or the position of said zoom lens.

9. The illuminating arrangement of claim 1, further comprising a glass rod defining a light integrator; and, said glass rod being arranged on said optical axis downstream of said zoom objective.

10. The illuminating arrangement of claim 9, said glass rod having an output end face transverse to said optical axis;

and, the arrangement further comprising a masking system positioned at said output end face.

11. The illuminating arrangement of claim 9, wherein: the path of the light emanating from said glass rod is unobstructed by a beam-shaping diaphragm.

12. The illuminating arrangement of claim 1, said light source including a lamp mirror defining a focus on said optical axis; and, a diaphragm mounted on said optical axis outside of said focus to define a secondary light source.

13. The illuminating arrangement of claim 1, wherein said first and second displacement drives are program controlled by a computer.

14. The illuminating arrangement of claim 1, wherein said one zoom lens is a first zoom lens and said zoom objective includes a second zoom lens; and, said first displacement drive is adapted to shift both said first and second zoom lenses along said optical axis.

15. The illuminating arrangement of claim 14, said first zoom lens of said zoom objective having first and second lens components arranged on said optical axis; one of said lens components being movable along said axis toward or away from the other one of said lens components; said other lens component being stationary and said lens components having respective lens surfaces facing each other; and, said lens surfaces having almost the same radius of curvature; and, said one lens component being movable so as to bring said lens surfaces in mutual contact engagement.

16. The illuminating arrangement of claim 15, said first and second lens components consisting of glass having the same index of refraction (n).

17. The illuminating arrangement of claim 16, wherein said second zoom lens is downstream of said axicons; and, said one lens component and said second zoom lens are positioned far away from said two axicons for low values of said coherence factor σ and close to said two axicons for high values of said coherence factor σ.

18. An illuminating arrangement for an optical system such as a microlithographic projection exposure apparatus, the illuminating arrangement comprising:

a light source for emitting illuminating light along an optical axis;

a zoom objective mounted on said optical axis having first and second zoom lenses for transmitting light;

a first displacement drive for shifting one of said zoom lenses along said axis to adjust the coherence factor σ of said light transmitted by said lenses;

two axicons integrated within said zoom objective; and, a second displacement drive for shifting said two axicons relative to each other along said optical axis for adjusting the distance therebetween.

19. The illuminating arrangement of claim 18, wherein said two axicons are arranged between said first and second zoom lenses.

* * * * *